(12) United States Patent
Lin et al.

(10) Patent No.: US 6,649,473 B1
(45) Date of Patent: Nov. 18, 2003

(54) METHOD OF FABRICATING A FLOATING GATE FOR SPLIT GATE FLASH MEMORY

(75) Inventors: Chi-Hui Lin, Taipei (TW); Chung-Lin Huang, Taichung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/330,777

(22) Filed: Dec. 27, 2002

(30) Foreign Application Priority Data

May 22, 2002 (TW) .................................... 91110704 A

(51) Int. Cl.⁷ ............................................ H01L 21/336
(52) U.S. Cl. ...................... 438/257; 438/201; 438/211; 438/267
(58) Field of Search ................................ 438/201, 257, 438/259, 261, 211, 266, 267

(56) References Cited

U.S. PATENT DOCUMENTS 5,972,752 A * 10/1999 Hong .......................... 438/264
6,180,461 B1 * 1/2001 Ogura ......................... 438/266
6,482,700 B2 * 11/2002 Chen et al. .................. 438/267
6,511,881 B1 * 1/2003 Lin ............................. 438/257
6,562,673 B2 * 5/2003 Lin ............................. 438/211

\* cited by examiner

Primary Examiner—Kevin M. Picardat
(74) Attorney, Agent, or Firm—Nelson A. Quintero

(57) ABSTRACT

A method of fabricating a floating gate for a flash memory. An active region is formed on a semiconductor substrate. A first insulating layer, a first conductive layer and a masking layer are sequentially formed in the active region. A part of the masking layer is removed to form a first opening. A second conductive layer is formed to cover the masking layer and the bottom surface and sidewall of the first opening. A second insulating layer is formed on the second conductive layer to fill the first opening. An oxidation process is performed until the second conductive layer in contact with the second insulating layer over the masking layer is oxidized into a third insulating layer. The second and third insulating layers are removed to form a second opening. A fourth insulating layer fills in the second opening. The masking layer and the first conductive layer underlying the masking layer uncovered by the fourth insulating layer are removed.

15 Claims, 5 Drawing Sheets

METHOD OF FABRICATING A FLOATING GATE FOR SPLIT GATE FLASH MEMORY

BACKGROUND OF THE INVENTION

1. Field of the Invention

The present invention relates in general to a method of fabricating a nonvolatile semiconductor memory device. More particularly, it relates to a method of fabricating a floating gate for a split gate flash memory.

2. Related Art of the Invention

Complementary metal-oxide semiconductors (CMOS's) can be classified in two major categories, random access memory (RAM) and read only memory (ROM). Random access memory is a volatile memory from which the stored data disappears when powered off. In contrast, the data stored in a read only memory is not affected when powered off. In the past few years, the market occupancy of the read only memories has gradually increased, of which the expansion of flash memory is most significant. The electrical programmable function allows a single memory cell of the flash memory to be written to. In addition, the flash memory can also be electrically erased block-by-block, wherein each block comprises multiple memory cells. Application flexibility and convenience are superior to electrically programmable read only memory (EPROM), electrically erasable programmable read only memory (EEPROM) and programmable read only memory. More importantly, the fabrication cost of flash memory is low. Due to the above advantages, flash memories have been broadly applied to electronic products such as digital cameras, digital camcorders, cellular phones, portable computers, personal stereos, and personal digital assistants (PDA). More and more products use flash memory for data and information storage. To accommodate portability, electronic products are increasingly smaller, but with more varied and powerful functionality. Data processing and storage capacities are thus larger. Capacity of flash memories has thus increased from about 4 MB to about 256 MB. Flash memory of about 1 GB capacity is foreseeable. In the conventional fabrication process of the split gate flash memory, including the most crucial process to form the floating gate, the application of a photomask is inevitable. A conventional process to form a floating gate of a memory cell of a split gate flash memory is introduced as follows.

In FIG. 1A, a thermal oxidation process is performed on a P-type substrate 100. For example, the local oxidation process (LOCOS) is performed to form a field oxide layer (not shown) to define an active region. A first insulating layer 110 is formed on the active region of the substrate 100. A chemical vapor deposition (CVD) process is performed to deposit a doped polysilicon layer on the first insulating layer 110, so that a first conductive layer 115 is formed. A silicon nitride layer is formed on the first conductive layer 115 as a masking layer 120. The masking layer is used as a hard mask in the subsequent process.

Referring to FIG. 1B, a part of the masking layer 120 is removed to form an opening 125 which exposes the surface of the first conductive layer 115.

Referring to FIG. 1C, an oxidation process is formed to a floating gate oxide layer 130 on the exposed first conductive layer 115.

In FIG. 1D, an isotropic etching process is performed to remove the masking layer 120. Anisotropic etching is performed using the floating gate oxide layer 130 as a hard mask, so that the remaining first conductive layer 115 and the first insulating layer 110 uncovered by the floating gate oxide layer 130 are removed successively to leave the portions underlying the floating gate oxide layer 130. As a result, the surface of the substrate 110 is exposed. The remaining first conductive layer 115 serves as the floating gate 136, while the remaining first insulating layer 110 serves as the gate insulating layer 112. The poly tip 138 is formed for the floating gate 130 to perform spike discharge during the erase operation of the flash memory. The floating gate of the conventional split gate flash memory is thus completed.

In the conventional fabrication as above, the hard mask defines an opening. The surface of the conductive layer exposed in the opening is then oxidized to form the floating gate oxide layer. Anisotropic etching technique is then applied to remove the doped polysilicon conductive layer uncovered by the floating gate oxide layer. The floating gate is thus formed on the remaining doped polysilicon conductive layer underlying the floating gate oxide layer. However, to comply with the high integration demand, the dimensions of all devices have to be reduced. The conventional fabrication process that uses the hard mask to remove the uncovered polysilicon layer to form the poly tip results in the sharpness of the poly tip being insufficient when device dimensions are reduced. As a result, function and performance of the split gate flash memory are impacted.

SUMMARY OF THE INVENTION

In the present invention, a masking layer with an opening is formed on the conductive layer, followed by a process for filling the opening with a material with low oxygen diffusion coefficient. In the subsequent oxidation process, the barrier of such material with low oxygen diffusion coefficient allows differential oxidation rate in the opening. Oxidation rate of the conductive layer is faster near the upper portion of the opening. With the remaining conductive layer on the lower sidewall and bottom surface of the opening, a sharper poly tip is formed. The poly tip, the remaining conductive layer on the bottom surface and lower sidewall of the opening, and the underlying conductive layer construct the floating gate. Such process is adapted in the present invention to form a split gate floating gate. The process adapted in the present invention is more easily controlled than conventional fabrication. Moreover, the poly tip formed by the present invention is sharper.

A method for fabricating a floating gate of a flash memory cell is provided by the present invention. The fabrication method comprises the following steps. A semiconductor substrate is provided. An active region is defined in the surface of the semiconductor substrate. A first insulating layer is formed in the active region on the substrate. A first conductive layer is formed on the first insulating layer, and a masking layer is formed on the first conductive layer. A part of the masking layer is removed to form a first opening. A second conductive layer is formed to cover the masking layer and the bottom surface and sidewall of the first opening. A second insulating layer is formed on the second conductive layer and fills the first opening. A thermal oxidation process is performed to oxidize the surface of the second conductive layer in contact with the second insulating layer, such that a third insulating layer is formed between second conductive layer and insulating layer. Because oxygen diffuses slowly in the second insulating layer, oxidation of the second conductive layer is faster near the upper portion of the first opening. As the conductive layer on the bottom surface and lower sidewall of the first opening are not fully oxidized, a poly tip is formed on the second conductive layer at the corner of the first opening, that is, at the joint of the lower sidewall and the bottom surface of the first opening. The second and third insulating layers are then removed to form a second opening, so that the remaining second conductive layer and the poly tip are exposed. A fourth insulating layer fills in the second opening as a floating gate insulating layer. The masking layer and the first conductive layer underlying the masking layer are then removed. Thus, a floating gate is formed by the remaining second and first conductive layers.

BRIEF DESCRIPTION OF THE DRAWINGS

These, as well as other features of the present invention, will become more apparent upon reference to the drawings wherein.

DETAILED DESCRIPTION OF THE PREFERRED EMBODIMENT

Figure 1A:
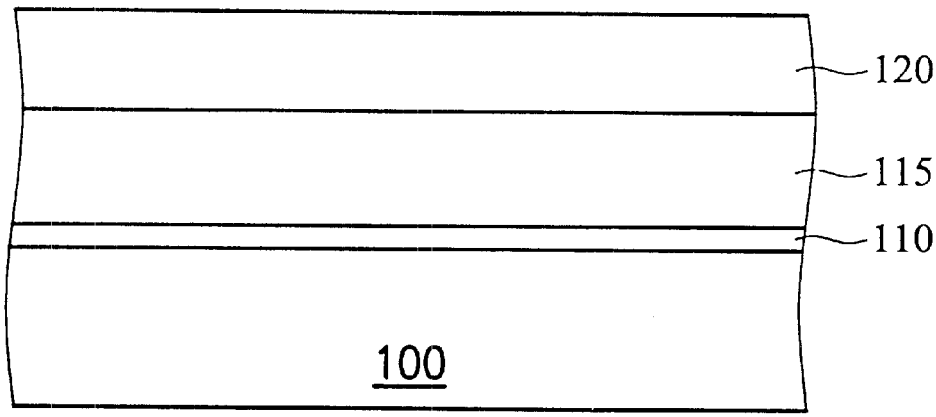
FIGS. 1A to 1D show the conventional fabrication process to form a floating gate of a split gate flash memory.
Figure 1B:
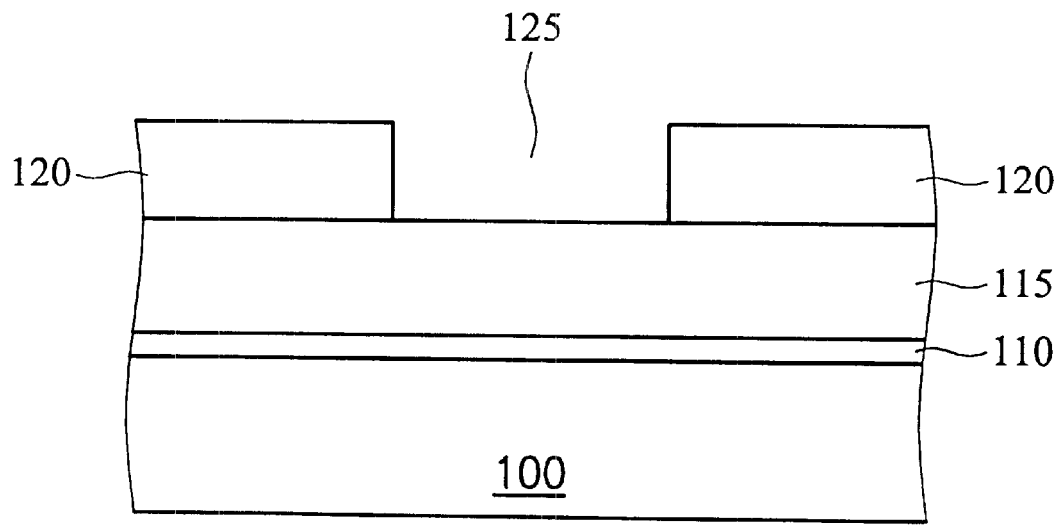
Figure 1C:
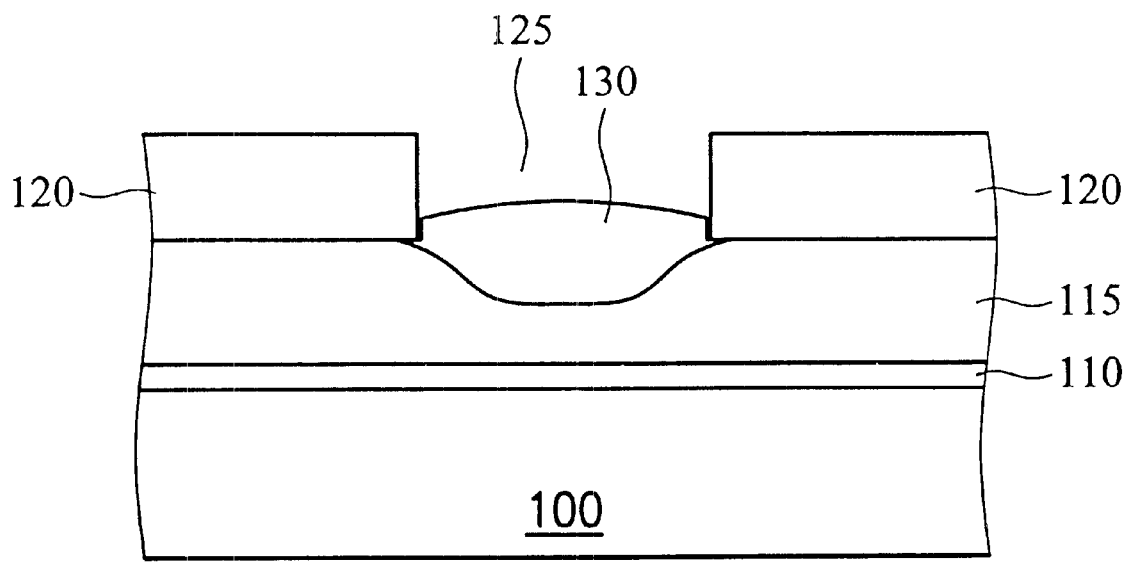
Figure 1D:
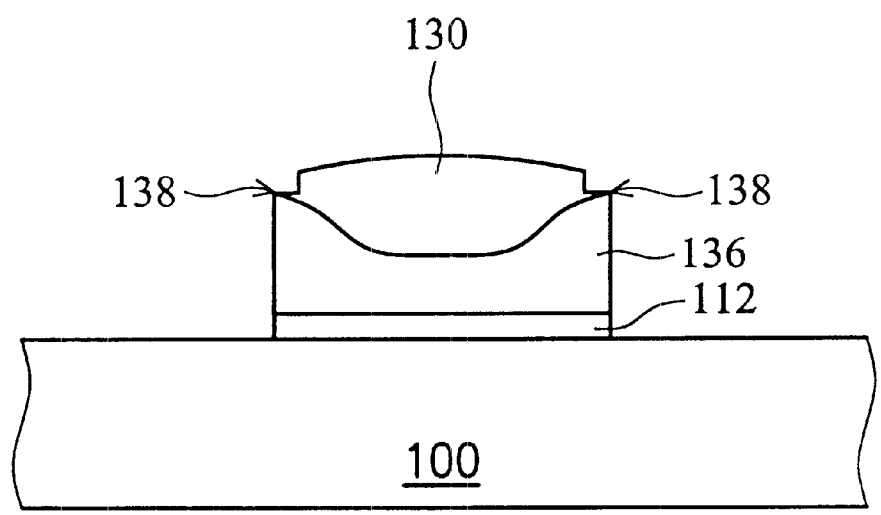
Figure 2A:
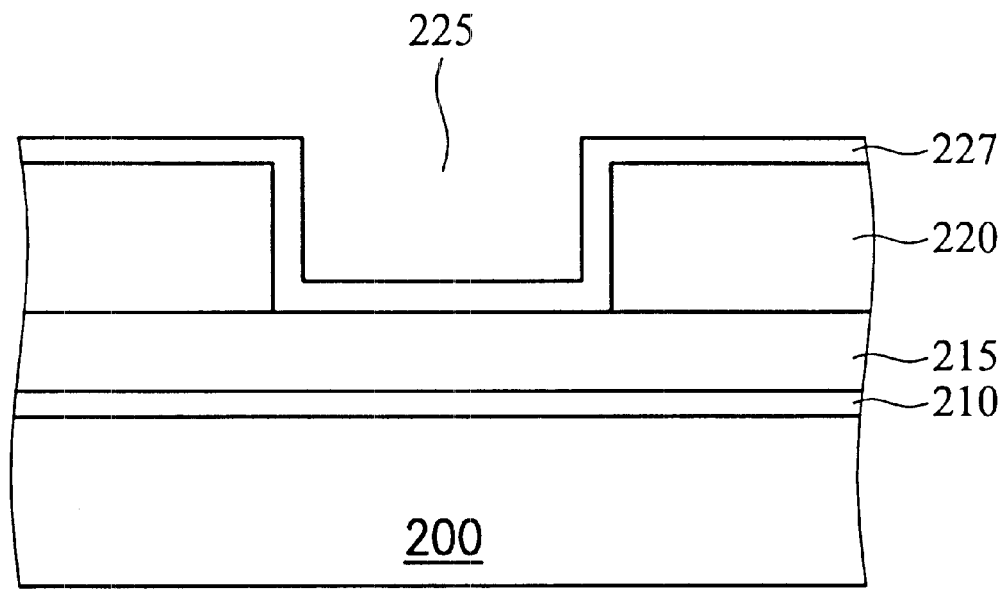
FIGS. 2A to 2F show the fabrication process to form a floating gate of a split gate flash memory according to one embodiment of the present invention.

In FIG. 2A, a substrate 200 is provided. The substrate 200, is, for example, semiconductor material such as silicon. The process to form the substrate 200 includes epitaxy or silicon on insulator. In this embodiment, a P-type substrate is used as an example for convenience. A field insulating layer (not shown) is formed on the P-type substrate 200 to define an active region (not shown) by shallow trench isolation process or local oxidation, for example. On the active region of the substrate 200, a first insulating layer 210 is formed. The first insulating layer 210 can be silicon oxide with a thickness of about 80 angstroms to about 200 angstroms, for example, and the fabrication process includes oxidation. A first conductive layer 215 with a thickness of about 100 angstroms to about 1000 angstroms is formed on the first insulating layer 210. The first conductive layer 215 includes a polysilicon layer formed by chemical vapor deposition (CVD), for example. To impress conductivity into the polysilicon layer, arsenic or phosphoric ions may be doped via diffusion or ion implantation. Or alternatively, an in-situ doped polysilicon layer can be formed. A masking layer 220 is formed on the first conductive layer 215. The masking layer 220 includes a silicon nitride layer formed by low-pressure chemical vapor deposition with a thickness of about 1000 angstroms to about 5000 angstroms, for example. A photolithography and etching process is performed to remove a part of the masking layer 220; and a first opening 225 is formed. A second conductive layer 227 with a thickness of about 50 angstroms to about 500 angstroms is formed on the masking layer 220, while the bottom surface and the sidewall of the first opening 225 are covered thereby. The second conductive layer 227 includes a polysilicon layer formed by chemical vapor deposition. Similarly, to impress conductivity into the second conductive layer 227, arsenic or phosphoric ions are introduced by diffusion or ion implantation. Alternatively, a doped polysilicon layer formed by in-situ doping process can be formed as the second conductive layer 227.

Figure 2B:
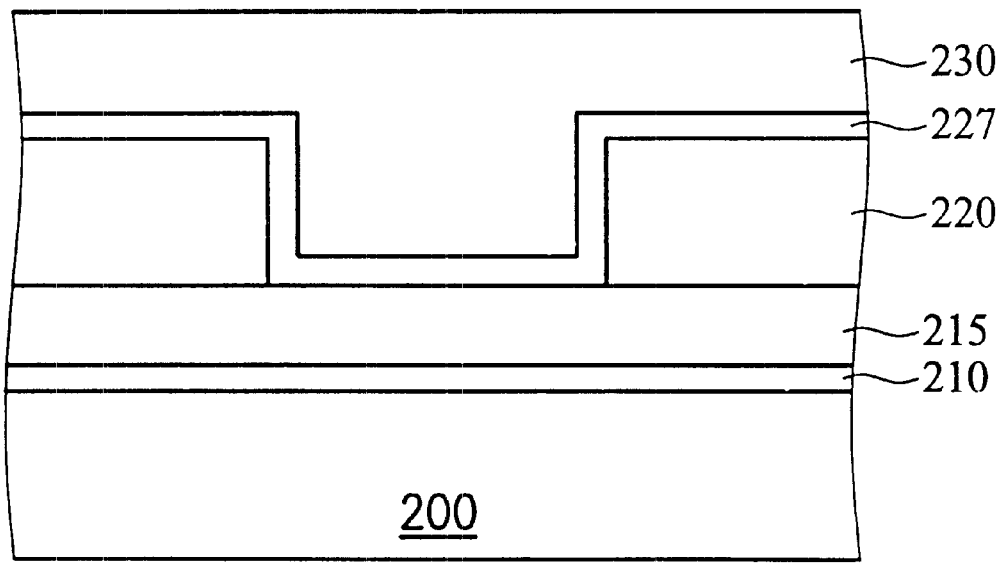

Referring to FIG. 2B, a second insulating layer 230 is deposited on the second conductive layer 227 and fills the first opening 225. The second insulating layer 230 is a material with low oxygen diffusion coefficient such as silicon oxy-nitride or other low oxygen diffusion coefficient material. The method to form the second insulating layer 230 may be low-pressure chemical vapor deposition, and the thickness thereof is about 3000 angstroms to about 5000 angstroms, for example.

Figure 2C:
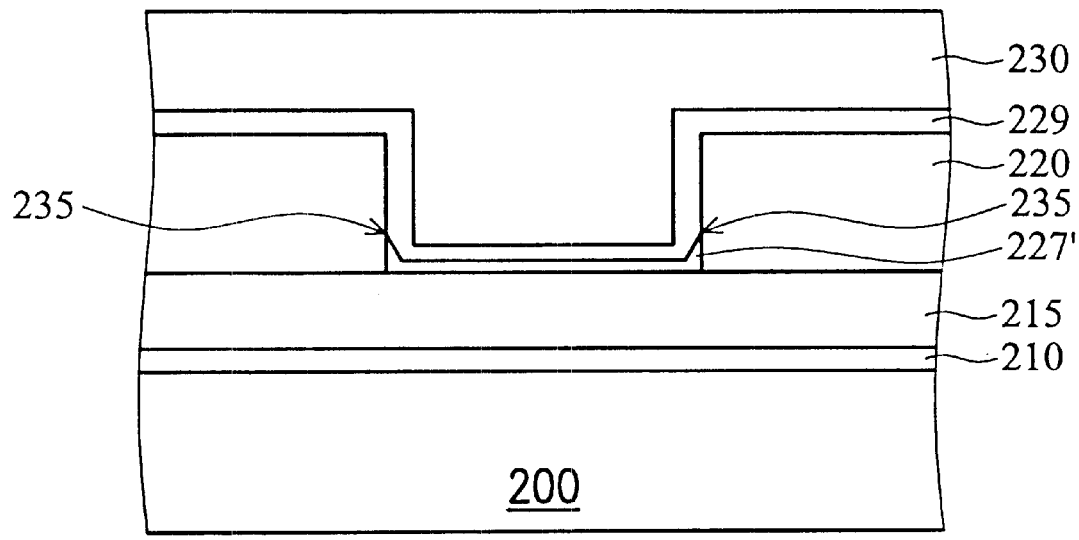

Referring to FIG. 2C, thermal oxidation is performed, such that oxygen molecules can penetrate the second insulating layer 230 to react with most of the second conductive layer 227 to form a third insulating layer 229 between the second insulating layer 230 and the second conductive layer 227. However, due to the topology of the first opening 225, the second insulating layer 230 formed on the bottom surface and sidewall thereof is much thicker than that formed over other position of the substrate 200. The second insulating layer 230 formed in the first opening 225 thus functions as a barrier oxidizing the underlying second conductive layer 227. Oxidation rate becomes slower from top to bottom in the first opening 225. That is, the second conductive layer 227 formed on the bottom surface and the lower sidewall of the first opening 225 will not be oxidized in the thermal oxidation as the oxygen molecules are blocked by the second insulating layer 230, or only a negligible portion of the third conductive layer 227 will be oxidized into the third insulating layer 229 in the first opening 225. As a result, the remaining second conductive layer denoted as 227' at the corner, that is, the joint between the sidewall and the bottom surface of the first opening 225, has an arc profile with an upward pointing tip. The upward pointing tip is referred as the poly tip 235.

Figure 2D:
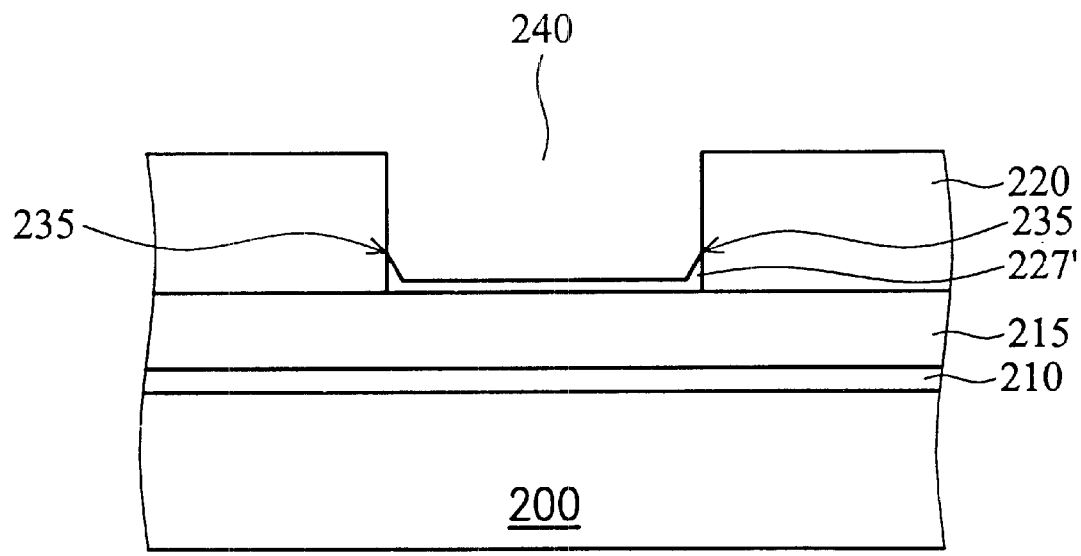

Referring to FIG. 2D, etching is performed to remove the second insulating layer 230 and the third insulating layer 229, and a second opening 240 is formed to expose the remaining second conductive layer 227' and the poly tip 235. The etching process includes an isotropic etching process.

Figure 2E:
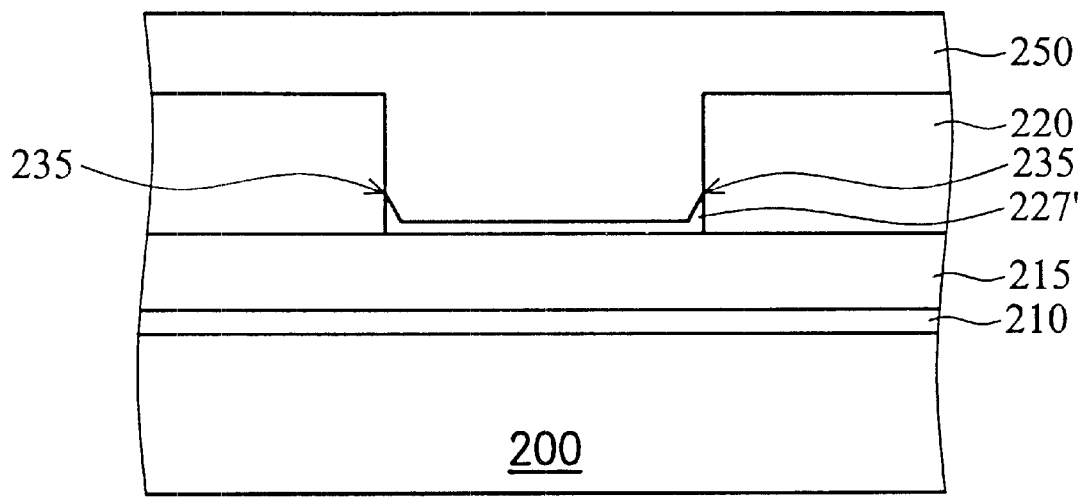

Referring to FIG. 2E, a fourth insulating layer 250 is formed on the masking layer 220 and fills the second opening 240. The fourth insulating layer 250 includes a silicon oxide layer formed by chemical vapor deposition, for example. The thickness of the fourth insulating layer 250 is about 1500 angstroms to about 3000 angstroms.

Figure 2F:
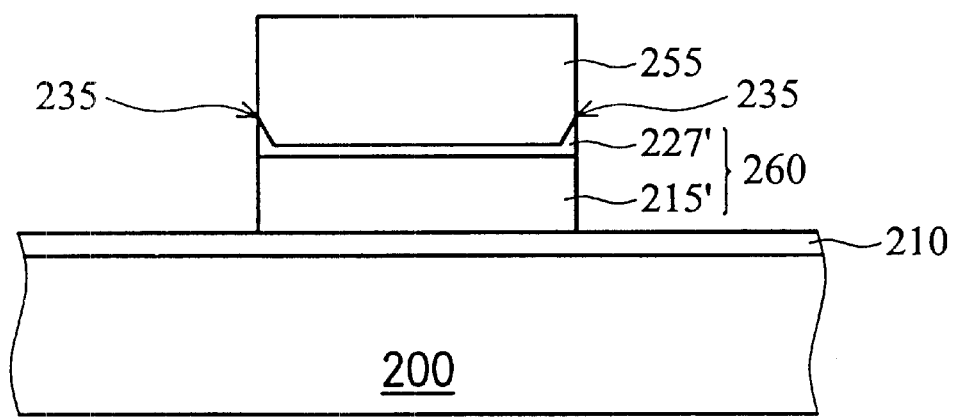

Referring to FIG. 2F, planarization such as a chemical mechanical polishing process (CMP) is performed with the masking layer 220 as the polishing stop. The fourth insulating layer 250 over the masking layer 220 is thus removed, while the fourth insulating layer 250 remaining in the second opening 240 functions as a floating gate insulating layer 255. Using the floating gate insulating layer 255 as a hard mask, etching is performed to remove the masking layer 220 and the underlying first conductive layer 215. The first conductive layer remaining under the remaining fourth insulating layer 250 is denoted by the reference numeral 215'. A floating gate 260 is thus formed by the remaining first and second conductive layers 215' and 227'.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a floating gate of a flash memory, comprising:

providing a semiconductor substrate;

defining an active region of the substrate;

forming a first insulating layer on the active region;

forming a first conductive layer on the first insulating layer;

forming a masking layer on the first conductive layer;

removing a part of the masking layer to form a first opening;

forming a second conductive layer to cover the masking layer and a sidewall and a bottom surface of the first opening;

forming a second insulating layer on the second conductive layer and fills the first opening;

performing an oxidation process, such that the second conductive layer over the masking layer under the second insulating layer is oxidized into a third insulating layer, while the second conductive layer on the lower sidewall and the bottom surface of the first opening is not fully oxidized, and a poly tip is formed on the remaining second conductive layer at a joint between the sidewall and the bottom surface;

removing the second and the third insulating layers to form a second opening that exposes the remaining second conductive layer and the poly tip;

forming a fourth insulating layer on the masking layer and filling the second opening;

planarizing the fourth insulating layer until the masking layer is exposed, while the fourth insulating layer remains in the second opening as a floating gate insulating layer; and removing the masking layer uncovered by the floating gate insulating layer and the first conductive layer underlying the uncovered masking layer, with a floating gate formed by the remaining first and second conductive layers.

2. The method according to claim 1, wherein the substrate comprises a silicon substrate.

3. The method according to claim 1, wherein the step of forming the first insulating layer includes the step of performing oxidation to form a silicon oxide layer.

4. The method according to claim 1, wherein the first insulating layer has a thickness of about 80 angstroms to about 200 angstroms.

5. The method according to claim 1, wherein the first conductive layer comprises a doped polysilicon layer.

6. The method according to claim 1, the first conductive layer has a thickness of about 100 angstroms to about 1000 angstroms.

7. The method according to claim 1, wherein the step of forming the masking layer includes the step of forming silicon nitride.

8. The method according to claim 1, wherein the masking layer has a thickness of about 1000 angstroms to about 5000 angstroms.

9. The method according to claim 1, wherein the second conductive layer comprises doped polysilicon.

10. The method according to claim 1, the second conductive layer has a thickness of about 50 angstroms to about 500 angstroms.

11. The method according to claim 1, wherein the step of forming the second insulating layer includes the step forming a material with a low oxygen diffusion coefficient.

12. The method according to claim 8, wherein the step of forming the second insulating later includes the step of forming silicon oxy-nitride.

13. The method according to claim 1, the second insulating layer has a thickness of about 3000 angstroms to about 5000 angstroms.

14. The method according to claim 1, wherein the step of forming the fourth insulating layer includes the step of forming silicon oxide.

15. The method according to claim 1, wherein the fourth insulating layer has a thickness of about 1500 angstroms to about 3000 angstroms.

* * * * *